US012749788B2

(12) United States Patent
Findeklee et al.

(10) Patent No.: US 12,749,788 B2
(45) Date of Patent: Sep. 29, 2026

(54) TRANSMISSION LINE WITH TWISTED COAXIAL CABLES

(71) Applicant: KONINKLIJKE PHILIPS N.V., Eindhoven (NL)

(72) Inventors: Christian Findeklee, Norderstedt (DE); Christoph Günther Leussler, Hamburg (DE)

(73) Assignee: Koninklijke Philips N.V., Eindhoven (NL)

(*) Notice: Subject to any disclaimer, the term of this patent is extended or adjusted under 35 U.S.C. 154(b) by 132 days.

(21) Appl. No.: 18/279,894

(22) PCT Filed: Mar. 1, 2022

(86) PCT No.: PCT/EP2022/055055
§ 371 (c)(1),
(2) Date: Sep. 1, 2023

(87) PCT Pub. No.: WO2022/184669
PCT Pub. Date: Sep. 9, 2022

(65) Prior Publication Data
US 2024/0154287 A1 May 9, 2024

(30) Foreign Application Priority Data
Mar. 4, 2021 (EP) .................................... 21160609

(51) Int. Cl.
*H01P 3/06* (2006.01)
*G01R 33/36* (2006.01)

(52) U.S. Cl.
CPC ................ *H01P 3/06* (2013.01); *G01R 33/36* (2013.01)

(58) Field of Classification Search
CPC . H01B 11/18; H01B 11/1895; H01B 11/1808; H01B 11/1817; H01B 11/1821;
(Continued)

(56) References Cited

U.S. PATENT DOCUMENTS 8,963,015 B2 2/2015 Wittkop
2002/0037054 A1 3/2002 Schuring
(Continued)

FOREIGN PATENT DOCUMENTS

CN 208077631 11/2018
EP 342671 A2 11/1989
(Continued)

OTHER PUBLICATIONS

IKrider et al "Broadband Antenna Systems for Lightning Magnetic Fields" Journal of Applied Meteorology, vol. 14, No. Jun. 2, 2012, 1974 p. 252-256.
(Continued)

*Primary Examiner* — Taelor Kim
*Assistant Examiner* — Tyler J Pereny

(57) ABSTRACT

According to the invention, a transmission line (10) for transmitting data and electrical power, comprising a first coaxial cable (20) with a first inner conductor (21) and a first outer conductor (22), and a second coaxial (30) cable with a second inner conductor (31) and a second outer conductor (32), wherein the first coaxial cable (20) and the second coaxial cable (30) are provided with an additional shield which is surrounding the first coaxial cable (20) and the second coaxial cable (30) and/or the first coaxial cable (20) and the second coaxial cable (30) are twisted around each other to form a twisted transmission line (10), and the first outer conductor (22) and the second outer conductor (32) are galvanically insulated from each other. In this way, a transmission line (10) for transmitting data and electrical power is provided which is compatible with use within an MRI apparatus and can be manufactured at low costs.

15 Claims, 3 Drawing Sheets

(58) Field of Classification Search
CPC ............. H04L 25/0272; H04L 25/0278; H04L 25/03878; H04B 2203/5425; H04B 2203/5445; H04B 2203/547; H04B 2203/5483; H04B 2203/5491; H04B 3/02
See application file for complete search history.

(56) References Cited

U.S. PATENT DOCUMENTS

| | | | | |
|---|---|---|---|---|
| 2003/0168240 | A1* | 9/2003 | Ono | H01B 11/1817 174/102 R |
| 2005/0116711 | A1* | 6/2005 | Kleihorst | G01R 33/3628 324/309 |
| 2010/0000780 | A1 | 1/2010 | Zhu et al. | |
| 2012/0012358 | A1* | 1/2012 | Horan | H04B 3/02 174/113 R |
| 2016/0134149 | A1 | 5/2016 | Yang et al. | |
| 2016/0372236 | A1* | 12/2016 | Yoshikawa | G02B 6/44715 |
| 2018/0342336 | A1* | 11/2018 | Watanabe | H01B 11/1834 |
| 2019/0061938 | A1 | 2/2019 | McCorkle | |
| 2020/0177239 | A1* | 6/2020 | Henry | H04B 3/56 |

FOREIGN PATENT DOCUMENTS

| | | | |
|---|---|---|---|
| EP | 1490704 | A1 | 12/2004 |
| WO | 2019103988 | A1 | 5/2019 |

OTHER PUBLICATIONS

International Search Report and Written Opinion from PCT/EP2022/055055 mailed May 16, 2022.

* cited by examiner

TRANSMISSION LINE WITH TWISTED COAXIAL CABLES

CROSS REFERENCE TO RELATED APPLICATIONS

This application is a U.S. national phase application of International Application No. PCT/EP2022/055055 filed on Mar. 1, 2022, which claims the benefit of EP Application Ser. No. 21160609.0 Mar. 4, 2021 and is incorporated herein by reference.

FIELD OF THE INVENTION

The invention relates to the field of transmission lines for transmitting data and electrical power, and in particular to transmission lines for transmitting data and electrical power within an MRI apparatus.

BACKGROUND OF THE INVENTION

There is a trend for almost all electronic applications to digitize signals as early as possible in receive chains. The main reason for this is the reduced sensitivity to disturbance (electromagnetic compatibility, EMC). The amount of data received by a single MRI coil element can be roughly estimated as follows: A resolution of 24 bit yields a dynamic range of 144 dB, which is sufficient for MRI. For a 500 kHz bandwidth, a sample rate of 1 MHz is demanded which defines a data rate of around 25 Mbit/s.

Conventional cabling of receive coils demands cables from each preamplifier to a distribution unit. By using not just a digital output but also one or more digital inputs, the data from several channels can be combined to be transmitted via a single physical channel which reduces the number of cables inside the receive coil. A short standard digital link using a single twisted pair like USB 3.0 can reach data rates of around 5 Gbit/s which would be sufficient to transfer the data of around 200 coil elements without compression.

However, the cables for transmitting this data within an MRI apparatus need to be compatible with high magnetic transmit fields as they are usual in the field of MRI, i.e. the cable need to be protected to not acting as a receive antennas for the $B_1$ field of a transmit body coil when transmitting the excitation pulse. In addition, the data needs to be shielded well in order not to couple back into the very sensitive receive array antenna during the acquisition. Besides the data transmission, also electrical power has to be provided for the receive elements in order to drive the receivers and the control electronics.

SUMMARY OF THE INVENTION

It is an object of the invention to provide a transmission line that meets above-mentioned requirements. Especially, it is an object of the invention to provide a lightweight and flexible transmission line for simultaneous transmission of data and electrical power which is compatible with use within an MRI apparatus and can be manufactured at low costs.

According to the invention, this object is addressed by the subject matter of the independent claims. Preferred embodiments of the invention are described in the sub claims.

Therefore, according to the invention, a transmission line for transmitting data and electrical power is provided, wherein the transmission line comprises a first coaxial cable with a first inner conductor and a first outer conductor, and a second coaxial cable with a second inner conductor and a second outer conductor, wherein the first coaxial cable and the second coaxial cable are provided with an additional shield which is surrounding the first coaxial cable and the second coaxial cable) and/or the first coaxial cable and the second coaxial cable are twisted around each other to form a twisted transmission line, and the first outer conductor and the second outer conductor are galvanically insulated from each other.

As explained further above, it is important to provide transmission lines that are compatible with high magnetic fields for an MRI apparatus. According to the present invention, a transmission line with a first coaxial cable and a second coaxial cable that are twisted may be provided. The twisted coaxial cables may function as a data and power connection inside an MRI coil. A capacitor between the outer conductors may be provided which acts like a short for the signal frequency and may minimize the effect of the outer conductors which is especially the reduction of common mode noise injection. By twisting the cable, the coupling from $B_1$ and gradient fields into the power line formed by the outer conductors may be reduced.

In this way, an inexpensive digital transmission line may be achieved that transmits the data in a similar way as a conventional shielded twisted pair line as e.g. used in USB, Ethernet or low voltage differential signaling (LVDS) but which is compatible with magnetic resonance.

Preferably, on the ends, both outer conductors are connected to a shared AC ground. The outer conductors are preferably connected to each other via a capacitor. Such a capacitor avoids a galvanic connection to ground the cable for the data but to allow still to transmit power. It may therefore also be one outer conductor directly connected to ground and the other one via a capacitor.

In general, different impedances may be used for the coaxial cables. According to a preferred embodiment of the invention, the first coaxial cable and the second coaxial cable each have an impedance of 50Ω. By using twice a standard 50Ω cable, the impedance resulting for the signal between the inner conductors is given by 100Ω, thus, fitting well to the standards defined for most serial digital data transmission lines.

According to a preferred embodiment of the invention, the first coaxial cable and/or the second coaxial cable are/is a micro coaxial cable, especially with an outer diameter of 0.2 to 1.0 mm. Such coaxial lines should be preferably chosen by very thin types in order to get a flexible cable. The two cables can be of the same but also of different types.

According to a preferred embodiment of the invention, a capacitor is provided that connects the first outer conductor and the second outer conductor. Preferably, such a capacitor is arranged at both ends of the transmission line, respectively.

According to a preferred embodiment of the invention, the transmission line comprises at least one additional capacitor which is connected between the first outer conductor of the first coaxial cable and the second outer conductor of the second coaxial cable. Therefore, capacitors can be used to connect the two outer shields at least at the ends of the transmission line but also in-between.

According to a preferred embodiment of the invention, the transmission line further comprises a third coaxial cable with a third inner conductor and a third outer conductor, and a fourth coaxial cable with a fourth inner conductor and a fourth outer conductor, wherein the third outer conductor and the fourth outer conductor are galvanically insulated from each other and from the first outer conductor and the second outer conductor. Preferably, all four outer conductors are connected via a set of capacitors in such a way that the impedance seen between the corresponding outer conductors of each transmission line are connected with a low impedance which is significantly lower than the characteristic impedance at all relevant signal frequencies. Preferably, the third outer conductor is connected to the first outer conductor via a capacitor and to the fourth outer conductor via a capacitor, and the fourth outer conductor is connected to the second outer conductor via a capacitor. Hence, the transmission line may also be made of four twisted coaxial cables forming two shielded digital transmission lines. At very low frequencies, the shields of the coaxial cables are less efficient. To prevent coupling, it is preferred to use the diagonal neighbors for building a channel. In that way, the electric and magnetic coupling is reduced since the resulting fields are orthogonal. Hence, the transmission line can be used for a bi-directional transmission with physically separated lines. With respect to this design, it is a preferred embodiment of the invention to have capacitors between the outer conductors of the corresponding diagonal transmission lines, or between each outer conductor and a shared ground plane at both terminating ends.

Further, according to the invention, an MRI radio frequency coil with a transmission line as described above is provided. Especially, the transmission line is used for transmitting data within a radio frequency receive coil for a radio frequency receiver system for an MRI apparatus. The transmission line is used inside a digital MRI coil, which is used in a very EMC-challenging environment like an MRI transmit body coil. Other examples of applications might be other mixed analog and digital applications especially with challenging EMC demands.

Further, according to the invention, a method for operating a transmission line is provided, wherein the transmission line comprises a first coaxial cable with a first inner conductor and a first outer conductor, and a second coaxial cable with a second inner conductor and a second outer conductor, wherein the first coaxial cable and the second coaxial cable are twisted around each other to form a twisted transmission line, and the first outer conductor and the second outer conductor are galvanically insulated from each other and connected to each other via one or more capacitors, and the method comprises the following method steps: conducting electrical power via the first outer conductor of the first coaxial cable and the second outer conductor of the second coaxial cable, and transmitting data via the first inner conductor of the first coaxial cable and the second inner conductor of the second coaxial cable. The power is transferred via the outer conductors of the coaxial cables, for example by a DC current. For the signal, the two inner conductors are used as a conventional twisted pair cable or twinax cable.

Further, according to the invention, a method for operating a transmission line is provided, wherein the transmission line comprises a first coaxial cable with a first inner conductor and a first outer conductor, and a second coaxial cable with a second inner conductor and a second outer conductor, a third coaxial cable with a third inner conductor and a third outer conductor, a fourth coaxial cable with a fourth inner conductor and a fourth outer conductor, wherein the first coaxial cable, the second coaxial cable, the third coaxial cable and the fourth coaxial cable are twisted around each other to form a twisted transmission line, wherein all outer conductors are galvanically insulated from all other outer conductors. Preferably, the outer conductors are connected AC-wise to share the same ground potential. Further, according to a preferred embodiment of the invention, the DC powering for this four-cable solution is provided between each two cables corresponding to one direction. This may reduce coupling from any non-constant DC currents into the transmission lines which further reduces potential EMC issues. Preferably, and the first outer conductor and the second outer conductor are connected to each other via a capacitor, the third outer conductor is connected to the first outer conductor via a capacitor and to the fourth outer conductor via a capacitor, and the fourth outer conductor is connected to the second outer conductor via a capacitor, and the method comprises the following method steps: conducting electrical power via the first outer conductor of the first coaxial cable, the second outer conductor of the second coaxial cable, the third outer conductor of the third coaxial cable and the fourth outer conductor of the fourth coaxial cable, transmitting data in a first data transmission direction via the first coaxial cable and the fourth coaxial cable, and transmitting data in a second data transmission direction via the second coaxial cable and the third coaxial cable, wherein the direction of the first data transmission and the direction of the second data transmission are at least temporarily opposite to each other. Hence, the transmission line can be used for a bi-directional transmission with physically separated lines. The power is transferred via the outer conductors of the coaxial cables. The signal is transferred in two different bi-directional transmission direction via the inner conductors of the coaxial cables.

Alternatively, the four outer conductors may be used to transmit three different supply or control signals. Preferably, the control signal is a safety-relevant signal which could add redundancy to further improve patient safety, e.g. to ensure the coil elements are sufficiently detuned during a transmit pulse.

In an arrangement with only two coaxial cables, the transmission directions of the first coaxial cable and of the second coaxial cable are identical. In an arrangement with four coaxial cables, the transmission directions of the signal are bi-directional, wherein the transmission direction of the first coaxial cable and the fourth coaxial cable are identical, and the transmission direction of the second coaxial cable and the third coaxial cable are identical.

According to a preferred embodiment of the invention, an implementation with just two cables might be used as a bidirectional line. With a good termination, both signals can in principle be separated at both ends. Alternatively, each single cable can transmit the signal in one direction.

According to a preferred embodiment of the invention, the cross section of the transmission line along most part of its length is such that the central axes of each coaxial cable are each aligned on one of the corners of a rectangle, wherein the central axes of the first coaxial cable and the fourth coaxial cable are aligned at opposing corners of the rectangle, and the central axes of the second coaxial cable and the third coaxial cable are aligned at the other opposing corners of the rectangle. Here, "along most part of its length" means more than 50% of its length. Further, "opposing corners of the rectangle" means the diagonally opposite corners. Hence, in this way, two highly shielded digital transmission lines are formed. For reduction of coupling at low frequencies, the diagonally opposite coaxial cables form a digital channel.

According to a preferred embodiment of the invention, the rectangle is a rhombus. In this respect, if all coaxial cables have the same diameter and are arranged as explained above, the rhombus becomes a square.

According to a preferred embodiment of the invention, the transmitted data is digital data and/or the electrical power is a DC current. Although digital transmission is explained above, technically the invention also works properly in an analogue domain. The power is transferred via the outer conductors of the coaxial cables by a DC current.

According to a preferred embodiment of the invention, the transmission line is combined, preferably muffled, with a flexible, preferably elastic thread to make the cable-bundle more robust to torsions, bendings and mechanical pull forces. According to a preferred embodiment of the invention, the transmission line may also be combined with further cables such as separate single wire or optical fibers. According to a preferred embodiment of the invention, the transmission line can be integrated in a flexible RF MRI coil to provide an analog or digital connection between RF preamplifiers or sensors to a processing unit. According to a preferred embodiment of the invention, the transmission line can be integrated in a catheter for heart ablation or other diagnostic purpose. According to a preferred embodiment of the invention, the transmission line can be applied for a sensor (camera, LIDAR, RADAR) providing a digital output data stream to bypass the distance to a processing unit. According to a preferred embodiment of the invention, the sensor can be an ultrasound, temperature, pressure, and/or acceleration sensing element.

According to a preferred embodiment of the invention, the method is used for a radio frequency receive coil of an MRI apparatus.

Further, according to the invention, a non-transitory computer-readable medium is provided which comprises instructions stored thereon, that when executed on a processor induce a radio frequency receiver system for an MRI apparatus to perform a method as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
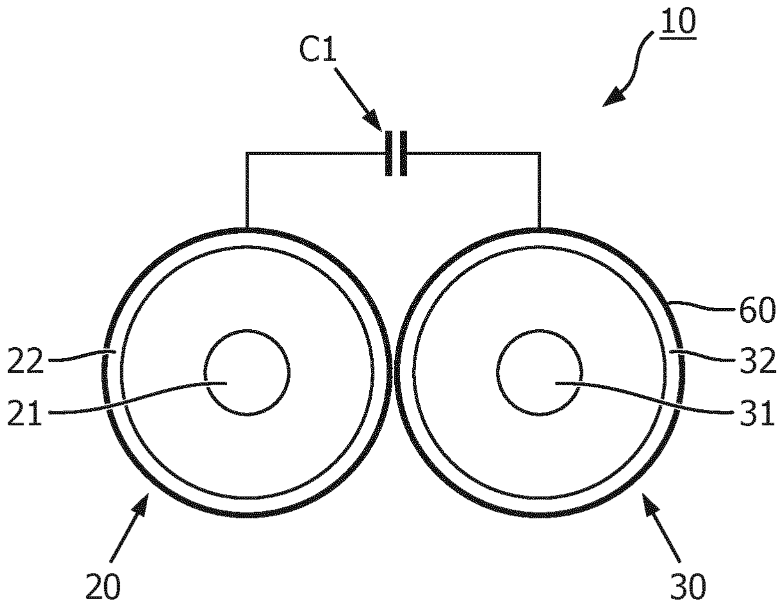
FIG. 1 schematically depicts a transmission line according to a preferred embodiment of the invention in a cross-sectional view.

FIG. 1 schematically depicts a transmission line 10 according to a preferred embodiment of the invention in a cross-sectional view. The transmission line 10 comprises a first coaxial cable 20 and a second coaxial cable 30. The first coaxial cable 20 comprises a first inner conductor 21 and a first outer conductor 22. The second coaxial cable 30 comprises a second inner conductor 31 and a second outer conductor 32. Both coaxial cables 20, 30 are galvanically insulated to the outside by the sheathing insulation 60. The first outer conductor 22 and the second outer conductor 32 are connected with each other via a capacitor C1.

Figure 2:
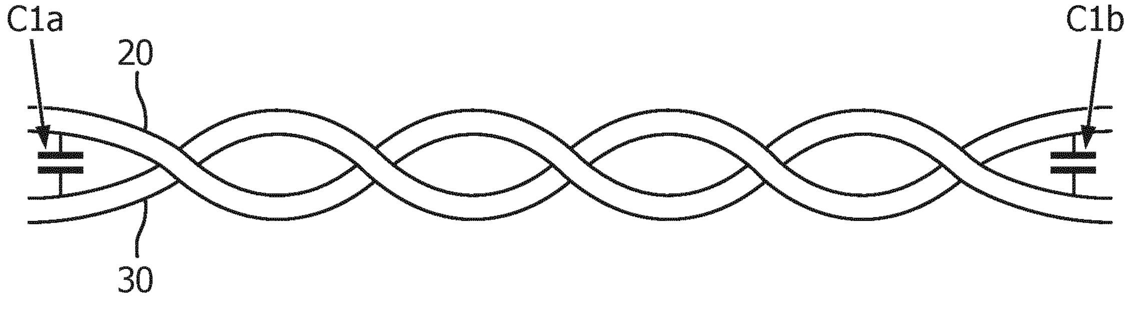
FIG. 2 schematically depicts a transmission line according to a preferred embodiment of the invention in a perspective view.

FIG. 2 schematically depicts a transmission line which is similar to the one of FIG. 1 in a perspective view. The first coaxial cable 20 and the second coaxial cable 30 are also twisted around each other. Here, both ends of the transmission line 10 are connected to each other via a respective capacitor C1*a*, C1*b*.

Figure 3:
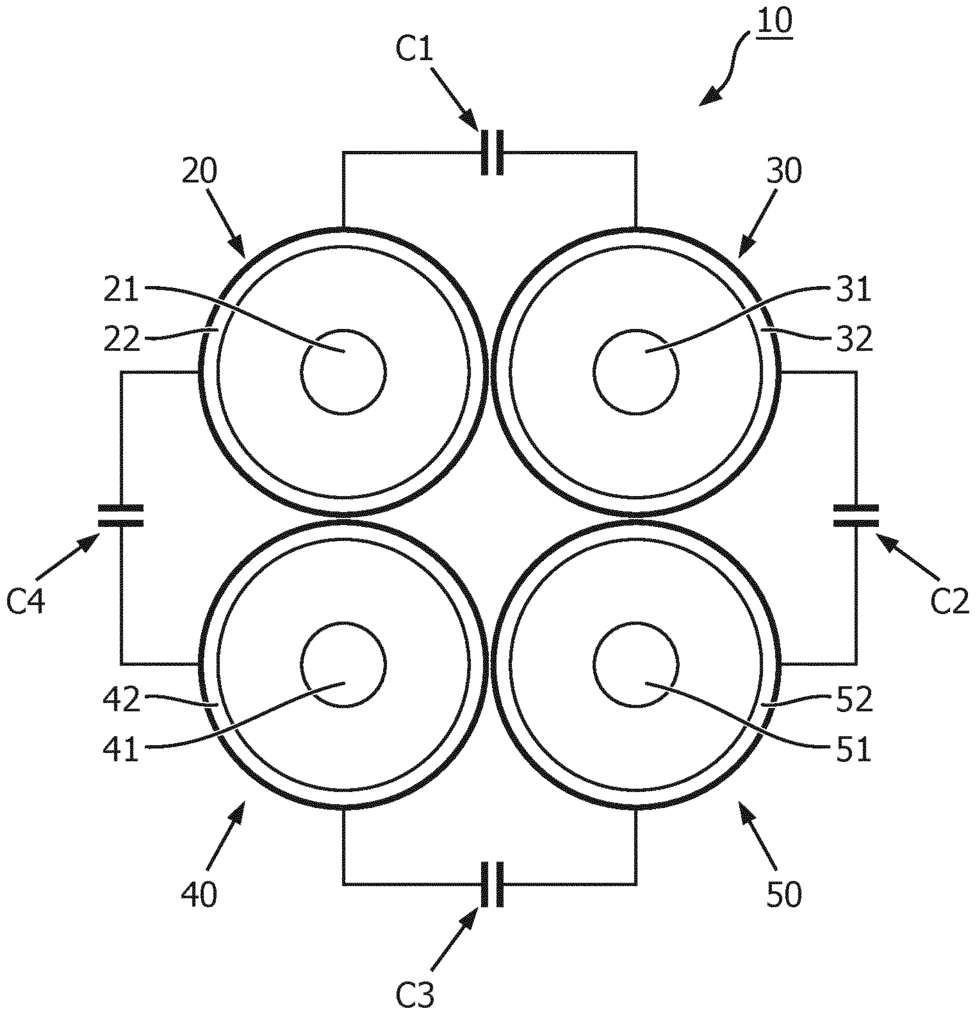
FIG. 3 schematically depicts a transmission line according to a further preferred embodiment of the invention in a cross-sectional view.

FIG. 3 schematically depicts a transmission line 10 with four coaxial cables 20, 30, 40, 50 in a cross-sectional view. The first coaxial cable 20 comprises a first inner conductor 21 and a first outer conductor 22. The second coaxial cable 30 comprises a second inner conductor 31 and a second outer conductor 32. The third coaxial cable 40 comprises a third inner conductor 41 and a third outer conductor 42. The fourth coaxial cable 50 comprises a fourth inner conductor 51 and a fourth outer conductor 52. The first outer conductor 22 and the second outer conductor 32 are connected via a first capacitor C1. The second outer conductor 32 and the fourth outer conductor 52 are connected via a second capacitor C2. The fourth outer conductor 52 and the third outer conductor 42 are connected via a third capacitor C3. The third outer conductor 42 and the first outer conductor 22 are connected via a fourth capacitor C4. The coaxial cables 20, 30, 40, 50 are arranged in a square. The first coaxial cable 20 and the fourth coaxial cable 50 are arranged in diagonally opposite corners of the square as well as the second coaxial cable 30 and the third coaxial cable 40 are arranged in the other diagonally opposite corners of the square.

Figure 4:
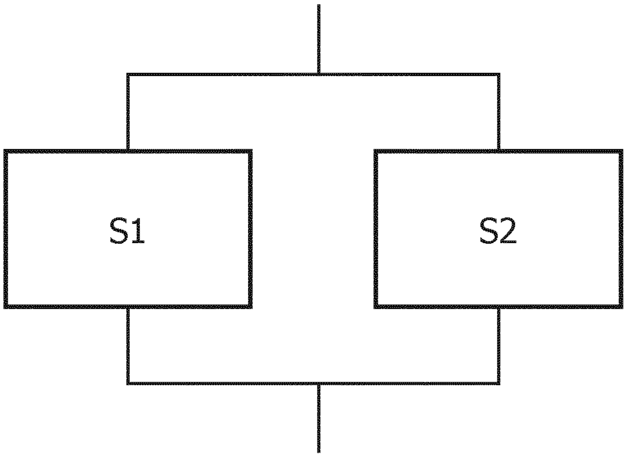
FIG. 4 schematically depicts a method according to a preferred embodiment of the invention.

FIG. 4 schematically depicts a method according to a preferred embodiment of the invention. In an arrangement with only two coaxial cables 20, 30 as shown in FIG. 1, electrical power is conducted via the first outer conductor 22 of the first coaxial cable 20 and the second outer conductor 32 of the second coaxial cable 30 in a first step S1, and data is transmitted via the first inner conductor 21 of the first coaxial cable 20 and the second inner conductor 31 of the second coaxial cable 30 in a second step S2. In an arrangement with four coaxial cables 20, 30, 40, 50 as shown in FIG. 3, electrical power is conducted via the first outer conductor 22 of the first coaxial cable 20, the second outer conductor 32 of the second coaxial cable 30, the third outer conductor 42 of the third coaxial cable 40 and the fourth outer conductor 52 of the fourth coaxial cable 50 in a first step S1. In a second step S2 data is transmitted via the first inner conductor 21 of the first coaxial cable 20, the second inner conductor 31 of the second coaxial cable 30, the third inner conductor 41 of the third coaxial cable 40 and the fourth inner conductor 51 of the fourth coaxial cable 50. For both described arrangements, the first step S1 and the second step S2 run in parallel.

Figure 5:
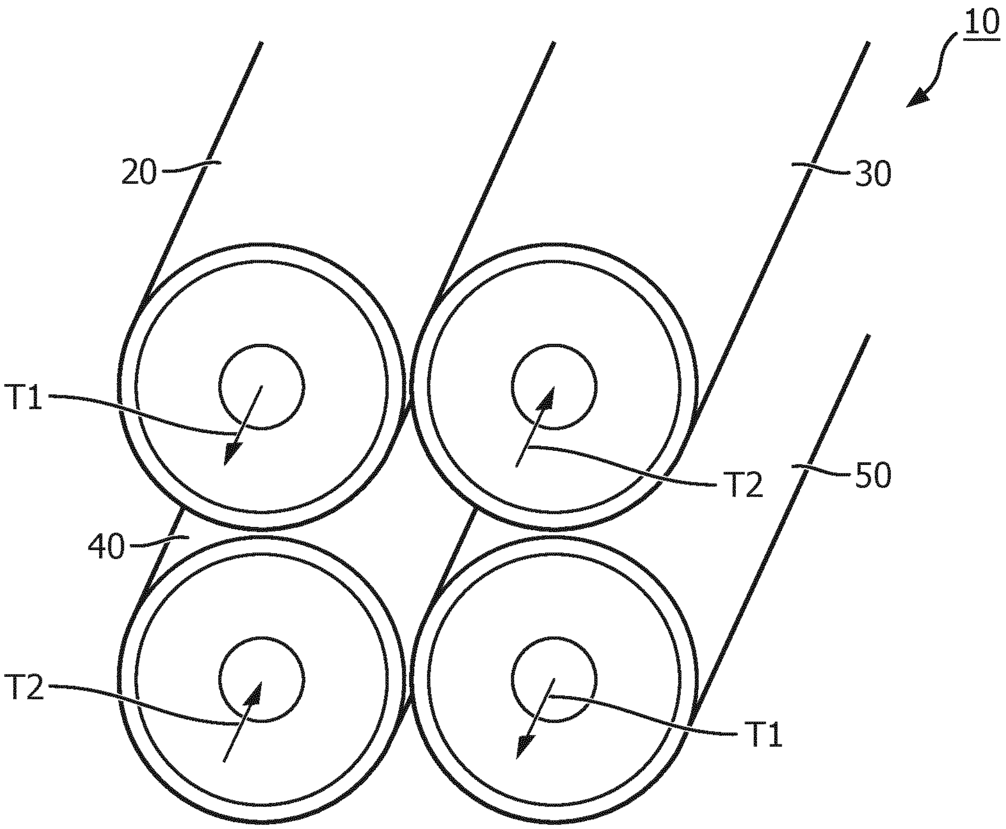
FIG. 5 schematically depicts a transmission line according to a further preferred embodiment of the invention in a perspective view.

FIG. 5 schematically depicts the four coaxial cables 20, 30, 40, 50 as shown in FIG. 3 in a perspective view. The first coaxial cable 20 and the fourth coaxial cable 50 are arranged in diagonally opposite corners as well as the second coaxial cable 30 and the third coaxial cable 40 are arranged in the other diagonally opposite corners. The first inner conductor 21 of the first coaxial cable 20 and the fourth inner conductor 51 of the fourth coaxial cable 50 transmit data in a first transmission direction T1. The second inner conductor 31 of the second coaxial cable 30 and the third inner conductor 41 of the third coaxial cable 40 transmit data in a second transmission direction T2. The first transmission direction T1 and the second transmission direction T2 are antiparallel.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST transmission line 10
first coaxial cable 20
first inner conductor 21
first outer conductor 22
second coaxial cable 30
second inner conductor 31
second outer conductor 32
third coaxial cable 40
third inner conductor 41
third outer conductor 42
fourth coaxial cable 50
fourth inner conductor 51
fourth outer conductor 52
isolation 60
capacitor C1
capacitor C1*a*
capacitor C1*b*
capacitor C2
capacitor C3
capacitor C4
first data transmission direction T1
second data transmission direction T2
conducting electrical power S1
transmitting data S2

The invention claimed is:

1. A transmission line, for transmitting data and electrical power, the transmission line comprising:

a first coaxial cable with a first inner conductor and a first outer conductor;

a second coaxial cable with a second inner conductor and a second outer conductor;

a third coaxial cable with a third inner conductor and a third outer conductor; and a fourth coaxial cable with a fourth inner conductor and a fourth outer conductor, wherein:

the first coaxial cable and the second coaxial cable are provided with an additional shield which is surrounding the first coaxial cable and the second coaxial cable, the first coaxial cable and the second coaxial cable are twisted around each other to form a twisted transmission line, the first outer conductor and the second outer conductor are galvanically insulated from each other, the third outer conductor and the fourth outer conductor are galvanically insulated from each other and from the first outer conductor and the second outer conductor, the first outer conductor is connected to the second outer conductor via at least one first capacitor, the third outer conductor is connected to the first outer conductor via at least one second capacitor and to the fourth outer conductor via at least one third capacitor, and the fourth outer conductor is connected to the second outer conductor via at least one fourth capacitor.

2. The transmission line of claim 1, wherein the first coaxial cable and the second coaxial cable each have an impedance of 50Ω.

3. The transmission line of claim 1, wherein the first coaxial cable and/or the second coaxial cable is a micro coaxial cable with an outer diameter of 0.2 to 1.0 mm.

4. The transmission line of claim 1, wherein the at least one first capacitor comprises a capacitor arranged at each end of the transmission line.

5. An MRI radio frequency coil comprising the transmission line according to claim 1.

6. The transmission line of claim 1, wherein the first inner conductor transmits data and the first outer conductor conducts electrical power, wherein the transmitted data is digital data.

7. The transmission line of claim 1, wherein the first and second outer conductors are connected to each other via the at least one first capacitor at ends of the first and second outer conductors, respectively.

8. The transmission line of claim 6, wherein the conducting electrical power and the transmitting data are run in parallel.

9. A method for operating a transmission line, the transmission line comprising a first coaxial cable with a first inner conductor and a first outer conductor, a second coaxial cable with a second inner conductor and a second outer conductor, a third coaxial cable with a third inner conductor and a third outer conductor, a fourth coaxial cable with a fourth inner conductor and a fourth outer conductor, at least one first capacitor connected between the first outer conductor of the first coaxial cable and the second outer conductor of the second coaxial cable, at least one second capacitor connected between the third outer conductor and the first outer conductor, at least one third capacitor connected between the third outer conductor and the fourth outer conductor, and at least one fourth capacitor connected between the fourth outer conductor and the second outer conductor, wherein the first coaxial cable, the second coaxial cable, the third coaxial cable and the fourth coaxial cable are twisted around each other to form a twisted transmission line, and wherein all outer conductors are galvanically insulated from all other outer conductors, the method comprising:

conducting electrical power via the first outer conductor of the first coaxial cable, the second outer conductor of the second coaxial cable, the third outer conductor of the third coaxial cable, and the fourth outer conductor of the fourth coaxial cable, transmitting data in a first data transmission direction via the first coaxial cable and the fourth coaxial cable, and transmitting data in a second data transmission direction via the second coaxial cable and the third coaxial cable, wherein:

the first data transmission direction and the second data transmission direction are at least temporarily opposite to each other, and the fourth coaxial cable is arranged diagonally from the first coaxial cable to prevent coupling in the first data transmission direction, and the third coaxial cable is arranged diagonally from the second coaxial cable to prevent coupling in the second data transmission direction.

10. The method of claim 9, wherein a cross section of the transmission line along most part of its length is such that central axes of each of the first, second, third and fourth coaxial cable are each aligned at one corner of corners of a rhombus, wherein the central axes of the first coaxial cable and the fourth coaxial cable are aligned at opposing corners of the rhombus, and the central axes of the second coaxial cable and the third coaxial cable are aligned at the other opposing corners of the rhombus.

11. The method of claim 10, wherein the rhombus is a square.

12. A non-transitory computer-readable medium, comprising instructions stored thereon, that when executed on a processor cause the processor to perform the method according to claim 9.

13. The method of claim 9, wherein the electrical power comprises a DC current.

14. The method of claim 9, wherein the first coaxial cable and the second coaxial cable each have an impedance of 50Ω.

15. The method of claim 9, wherein the first coaxial cable and/or the second coaxial cable is a micro coaxial cable, especially with an outer diameter of 0.2 to 1.0 mm.

* * * * *